(12) United States Patent
Safron et al.

(10) Patent No.: US 10,957,626 B2
(45) Date of Patent: Mar. 23, 2021

(54) SENSOR DEVICE WITH CARBON NANOTUBE SENSOR POSITIONED ON FIRST AND SECOND SUBSTRATES

(71) Applicant: Thermo Electron Scientific Instruments LLC, Madison, WI (US)

(72) Inventors: Nathaniel S. Safron, Madison, WI (US); Matthew Wayne Meyer, Madison, WI (US)

(73) Assignee: Thermo Electron Scientific Instruments LLC, Madison, WI (US)

( * ) Notice: Subject to any disclaimer, the term of this patent is extended or adjusted under 35 U.S.C. 154(b) by 51 days.

(21) Appl. No.: 16/215,819

(22) Filed: Dec. 11, 2018

(65) Prior Publication Data

US 2019/0189539 A1   Jun. 20, 2019

Related U.S. Application Data

(60) Provisional application No. 62/607,503, filed on Dec. 19, 2017.

(51) Int. Cl.
| | |
|---|---|
| *H01L 23/48* | (2006.01) |
| *G01N 27/12* | (2006.01) |
| *H01L 23/00* | (2006.01) |
| *H01L 21/768* | (2006.01) |
| *H01L 21/56* | (2006.01) |

(Continued)

(52) U.S. Cl.
CPC ............ *H01L 23/481* (2013.01); *B82Y 15/00* (2013.01); *G01N 27/127* (2013.01); *H01L 21/56* (2013.01); *H01L 21/76898* (2013.01); *H01L 23/3121* (2013.01); *H01L 24/05* (2013.01); *H01L 24/16* (2013.01); *G01N 27/122* (2013.01); *H01L 2224/02372* (2013.01); *H01L 2224/05644* (2013.01); *H01L 2224/05664* (2013.01); *H01L 2224/05666* (2013.01); *H01L 2224/05669* (2013.01); *H01L 2224/16225* (2013.01)

(58) Field of Classification Search
CPC combination set(s) only.
See application file for complete search history.

(56) References Cited

U.S. PATENT DOCUMENTS

| | | |
|---|---|---|
| 6,528,020 B1 | 3/2003 | Dai et al. |
| 7,317,256 B2 | 1/2008 | Williams et al. |

(Continued)

OTHER PUBLICATIONS

Huang, Cui et al. "Low-Capacitance Through-Silicon-Vias with Combined Air/SiO2 Liners," IEEE Transactions on Electron Devices 63.2, Feb. 2016, pp. 739-745, Abstract only. [IEEE Feb. 2016].

(Continued)

*Primary Examiner* — Nduka E Ojeh
(74) *Attorney, Agent, or Firm* — William R. McCarthy, III

(57) ABSTRACT

A sensing device includes a first substrate having a plurality of TSVs extending therethrough, and a second substrate positioned adjacent the first substrate, with the TSVs being electrically connected to the second substrate. At least one carbon nanotube sensor is positioned on the first substrate. Each of a plurality of contact pads is positioned on the first substrate and on one of the carbon nanotube sensors such that each contact pad is electrically connected to one of the TSVs and the one of the carbon nanotube sensors, and such that an end of the one of the carbon nanotube sensors is embedded in the contact pad.

30 Claims, 2 Drawing Sheets

(51) Int. Cl.
H01L 23/31 (2006.01)
B82Y 15/00 (2011.01)

(56) References Cited

U.S. PATENT DOCUMENTS

| | | |
|---|---|---|
| 8,193,615 B2 | 6/2012 | Haba et al. |
| 8,546,188 B2 | 10/2013 | Liu et al. |
| 8,772,946 B2 | 7/2014 | Uzoh et al. |
| 9,177,923 B2 | 11/2015 | Kim et al. |
| 9,224,796 B2 | 12/2015 | Colonna et al. |
| 9,252,092 B2 | 2/2016 | Lin et al. |
| 9,472,490 B1 | 10/2016 | Sullivan et al. |
| 9,553,039 B2 | 1/2017 | Cassidy et al. |
| 9,666,507 B2 | 5/2017 | Chen et al. |
| 9,741,657 B2 | 8/2017 | Filippi et al. |
| 2005/0184641 A1 | 8/2005 | Armitage et al. |
| 2007/0178477 A1* | 8/2007 | Joiner, Jr. ............ C12Q 1/6825 435/6.11 |
| 2011/0215002 A1* | 9/2011 | Martinez ............ G01N 27/4146 205/777.5 |
| 2011/0241185 A1 | 10/2011 | Koester et al. |
| 2012/0153454 A1* | 6/2012 | Liu ................... H01L 21/76898 257/712 |
| 2013/0263920 A1 | 10/2013 | Fidaner et al. |
| 2013/0337615 A1* | 12/2013 | Xu ........................ H01L 24/27 438/125 |
| 2014/0374916 A1 | 12/2014 | Bu et al. |
| 2015/0129941 A1* | 5/2015 | Zhang ................ H01L 27/3274 257/288 |
| 2015/0262879 A1* | 9/2015 | Sakai ................ H01L 21/3065 438/460 |
| 2016/0061677 A1* | 3/2016 | Han ..................... B81C 1/0023 257/415 |
| 2016/0181211 A1 | 6/2016 | Kamgaing et al. |
| 2016/0225694 A1 | 8/2016 | Barth et al. |
| 2016/0351472 A1 | 12/2016 | Park et al. |
| 2017/0040247 A1 | 2/2017 | Shen |
| 2017/0179056 A1 | 6/2017 | Schrems et al. |
| 2017/0200702 A1 | 7/2017 | Hung et al. |
| 2017/0213793 A1 | 7/2017 | Hurwitz et al. |

OTHER PUBLICATIONS

Huang, Cui et al. "Thermal and Electrical Properties of BCB-liner Through-Silicon Vias," IEEE Transactions on Components, Packaging and Manufacturing Technology, Dec. 2014, vol. 4, No. 12, pp. 1936-1946, Abstract only [IEEE Dec. 2014], Retrieved on Oct. 16, 2017 from ProQuest Dialog: https://dialog.proquest.com/professional/docview/1643345522?accountid=157282.

Karmakar, Aditya P. et al., "Material, Process and Geometry Effects on Through-Silicon Via Reliability and Isolation," 2010 MRS Spring Meeting—Advanced Interconnects and Chemical Mechanical Planarization for Micro and Nanoelectronics, San Francisco, CA, Apr. 5-9, 2010, vol. 1249, Abstract Only. [MRSSP], Retrieved on Oct. 16, 2017 from ProQuest Dialog: https://dialog.proquest.com/professional/docview/787363621?accountid=157282.

Majumder, Manoj Kumar et al., "Signal Integrity Analysis in Carbon Nanotube Based Through-Silicon Via," Active and Passive Electronic Components, vol. 24, Article ID 524107, 7 pages.

International Search Report and Written Opinion for Application No. PCT/US2018/065086, dated Mar. 27, 2019, 14 pages.

Shapiro, M. et al. "Reliable Through Silicon Vias for 3D Silicon Applications" 2009 IEEE International Interconnect Technology Conference—IITC, Sapporo, Hokkaido, Japan, Jun. 1, 2009—Jun. 3, 2009, Abstract only, [2009 IEEE Conf.], Retrieved on Oct. 16, 2017 from ProQuest Dialog: https://dialog.proquest.com/professional/docview/834699040?accountid=157282.

Sosna C., et al., "Miniaturized Thermal Flow Sensors with Through Silicon vias for Flip-Chip Packaging", Sensors, 2010 IEEE, Piscataway, NJ, USA, Nov. 1, 2010 (Nov. 1, 2010), pp. 2460-2463, XP031977817, DOI: 10.1109/ICSENS.2010.5690057, ISBN: 9781-4244-8170-5.

PCT/US2018/065086, International Preliminary Report on Patentability, dated Jul. 2, 2020, 8 pages.

\* cited by examiner

SENSOR DEVICE WITH CARBON NANOTUBE SENSOR POSITIONED ON FIRST AND SECOND SUBSTRATES

CROSS-REFERENCE TO RELATED APPLICATION

This application claims the benefit of U.S. provisional patent application no. 62/607,503, filed Dec. 19, 2017. The content of this application is incorporated by reference in its entirety.

FIELD OF THE INVENTION

Aspects of this invention relate generally to a sensor positioned on a first substrate and operably connected to a second substrate with a Through Substrate Via (TSV) extending through the first substrate, and more particularly, to a carbon nanotube device positioned on such substrates.

BACKGROUND OF THE INVENTION

Wire bonding is a traditional method to get electrical contact to a device such as a sensor on the top side of a substrate. Encapsulation is typically used to prevent mechanical damage to the fragile wire bonds. For devices that must be exposed to the environment, in particular sensors, the encapsulation must cover the wire bonds but leave the sensor area uncovered, which is difficult to make reliably and at large volumes through injection molding, epoxy micro pipetting, and dam and outside fill methods. Small sensor sizes may be necessary based on design considerations or to reduce cost by having more sensors per wafer. Wire bonding and encapsulating with an exposed device region is nearly impossible for small size devices. Additionally, for sensors immersed in an ionic liquid buffer such as for chemical, electrochemical, or biological sensors, any electrical connections to the device must be insulated from the buffer or ionic conduction will occur, reducing or disabling sensitivity.

The term Through Substrate Vias (TSVs) as used herein refer to an alternative to wire bonding, and provide connections to the device vertically through the substrate itself to soldered connections on the bottom of the substrate, connecting to another electrical device such as a printed circuit board.

It would be desirable to provide a sensor mounted to a substrate in use with a TSV that reduces or overcomes some or all of the difficulties inherent in prior known processes. Particular objects and advantages will be apparent to those skilled in the art, that is, those who are knowledgeable or experienced in this field of technology, in view of the following disclosure and detailed description of certain embodiments.

SUMMARY

In accordance with a first aspect, a sensing device includes a first substrate having a plurality of TSVs extending therethrough, and a second substrate positioned adjacent the first substrate, with the TSVs being electrically connected to the second substrate. At least one carbon nanotube sensor is positioned on the first substrate. Each of a plurality of contact pads is positioned on the first substrate and on one of the carbon nanotube sensors such that each contact pad is electrically connected to one of the TSVs and the one of the carbon nanotube sensors, and such that an end of the one of the carbon nanotube sensors is embedded in the contact pad.

In accordance with another aspect, a method of forming a sensing device includes the steps of forming a plurality of TSVs in a first substrate; depositing at least one carbon nanotube sensor on the first substrate; forming a pair of contact pads on the first substrate and on one of the carbon nanotube sensors such that each contact pad is electrically connected to one of the TSVs and to the one of the carbon nanotube sensors and such that an end of the one of the carbon nanotube sensors is embedded in the each contact pad; positioning the first substrate adjacent a second substrate; and forming an electrical connection between the TSVs and the second substrate.

In accordance with other aspects, a method of forming a sensing device includes the steps of forming a plurality of TSVs in a first substrate; depositing a plurality of carbon nanotube sensors on the first substrate; forming a plurality of pairs of contact pads on the first substrate and one of the carbon nanotube sensors such that each contact pad is electrically connected to one of the TSVs and to the one of the carbon nanotube sensors and such that an end of the one of the carbon nanotube sensors is embedded in the each contact pad; dicing the first substrate to form a plurality of first substrates, each of the plurality of first substrates including a plurality of carbon nanotube sensors, TSVs and contact pads, positioning each first substrate adjacent a second substrate; and forming electrical connections between the TSVs and the second substrates.

These and additional features and advantages disclosed here will be further understood from the following detailed disclosure of certain embodiments, the drawings thereof, and from the claims.

BRIEF DESCRIPTION OF THE DRAWINGS

The foregoing and other features and advantages of the present embodiments will be more fully understood from the following detailed description of illustrative embodiments taken in conjunction with the accompanying drawings in which.

Figure 1:
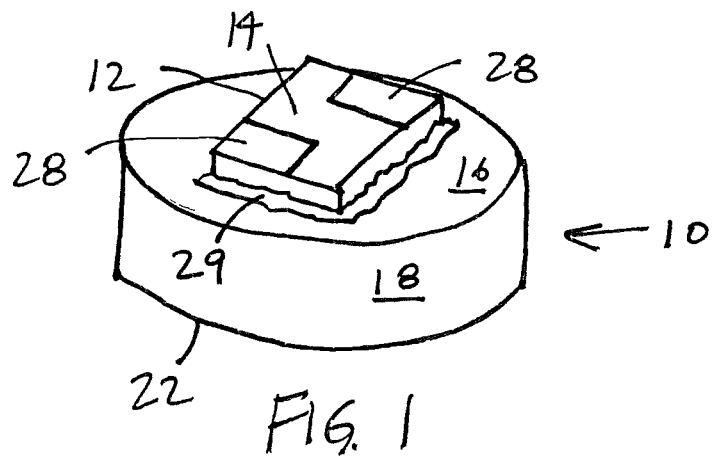
FIG. 1 is a perspective view of a sensing device mounted on first and second substrates.

The figures referred to above are not drawn necessarily to scale, should be understood to provide a representation of particular embodiments of the invention, and are merely conceptual in nature and illustrative of the principles involved. Some features of the sensing device depicted in the drawings have been enlarged or distorted relative to others to facilitate explanation and understanding. The same reference numbers are used in the drawings for similar or identical components and features shown in various alternative embodiments. Sensors used in combination with TSVs as disclosed herein would have configurations and components determined, in part, by the intended application and environment in which they are used.

DETAILED DESCRIPTION OF EMBODIMENTS

Figure 2:
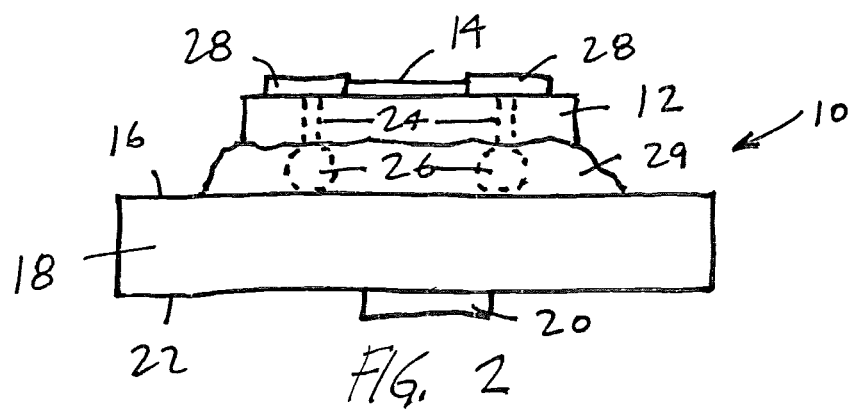
FIG. 2 is a section view of the sensing device of FIG. 1.

FIGS. 1-2 illustrate a representative sensing device 10 that may be used as a sensor that is exposed to an environment including material to be sensed. Sensing device 10 could be a gas sensor, a chemical sensor, an electrochemical sensor, a biological sensor, or any other desired type of sensor. Such sensors may be placed in a buffer solution, such as an ionic liquid buffer, and exposure to the buffer solution can be problematic for electrical components that often form part of such sensors. In particular, placing a sensor in such an aqueous solution can harm the electrical connections necessary for the sensor to operate.

Sensing device 10 may include a first substrate 12 upon which a sensor 14 may be positioned. In certain embodiments, first substrate 12 may be a wafer, slab, sheet, or die formed of silicon, glass, or other suitable materials. As discussed in greater detail below, first substrate 12 may be formed as part of a larger wafer, slab or sheet that is cut into smaller pieces, or dice, after formation. It is desirable to reduce the size of such sensing devices in order to produce more dies from each wafer, slab, or sheet, thereby providing a scalable sensing device that can be produced in large numbers in a cost efficient and automated manufacturing process.

Sensor 14 may be, in certain embodiments, a carbon nanotube sensor, e.g., a functionalized carbon nanotube substrate. Such a carbon nanotube sensor can detect changes in conductance when a target analyte or plurality of target analytes contact the functionalized carbon nanotube substrate. According to one aspect, a carbon nanotube wafer is created by coating the wafer with carbon nanotubes so as to produce an electrically conductive carbon nanotube substrate. Exemplary methods include a spin coated deposition process or continuous, floating evaporative self-assembly (FESA) process. One of skill in the art is to understand that other suitable methods known to those of skill may be employed to create the electrically conductive carbon nanotube substrate.

In certain embodiments, such a carbon nanotube substrate includes semiconducting single walled carbon nanotubes (s-SWCNTs). Such s-SWCNTs are characterized by a high surface area and semiconducting properties sufficient to produce a scalable sensitivity. In certain embodiments the carbon nanotube substrate may be planar. The carbon nanotube substrate may be a carbon nanotube semiconductor surface fashioned into a biosensor device that monitors electrical field charge carriers across the semiconductor material's surface. When binding events from biomolecular interactions occur and are coupled with the surface of the carbon nanotubes, the carrier concentration on the nanotube can change, which changes the conductivity. As target analytes bind to the functionalized nanotube surface, the current is altered and detected. In certain embodiments, the binding interaction occurs within the Debye screening length in order for the interaction to be detected. To enhance the sensitivity, small receptors such as fragmented antibodies, can be used.

The carbon nanotubes are single walled carbon nanotubes known to those of skill in the art and generally used for the manufacture of carbon nanotube substrates. Carbon nanotubes (CNTs), as are known in the art, are allotropes of carbon with a generally cylindrical nanostructure. In general, carbon nanotubes are characterized by a hollow cylindrical structure of given length with the walls formed by one-atom-thick sheets of carbon, called graphene. In general, graphene sheets are rolled or otherwise configured at specific and discrete ("chiral") angles, and the combination of the rolling angle and radius decides the nanotube properties, for example, whether the individual nanotube shell is a metal or semiconductor. Nanotubes are categorized as single-walled nanotubes (SWCNTs) and multi-walled nanotubes (MWCNTs). Individual nanotubes can naturally align themselves into "ropes" held together by van der Waals forces, more specifically, pi-stacking. Exemplary single-walled carbon nanotubes (SWCNTs) have a diameter of about 1 nanometer, but can be wider. According to one aspect, SWCNTs can exhibit a band gap from zero to about 2 eV and their electrical conductivity can show metallic or semiconducting behavior. Single-walled carbon nanotubes provide exemplary substrates for the detection devices described herein. A more detailed description of exemplary single-walled carbon nanotubes and methods of their manufacture are described in U.S. application Ser. No. 16/155,955, filed on Oct. 10, 2018, and entitled "Carbon Nanotube-Based Device for Sensing Molecular Interaction," the entire disclosure of which is incorporated herein by reference in its entirety for all purposes. Exemplary carbon nanotubes for use in devices are also described in U.S. Pat. Nos. 7,416,699, 6,528,020, and 7,166,325 each of which is hereby incorporated by reference in its entirety.

First substrate 12 may be positioned on or adjacent a first side 16 of a second substrate 18 such as a printed circuit board (PCB). A gate 20 may be positioned on a second side 22 of substrate 18 opposite first side 16. Gate 20 may be Au or Pt plated in certain embodiments.

Through Substrate Vias (TSVs) 24 may be formed in first substrate 12 in order to provide an electrical connection between sensor 14 and second substrate 18, as described in greater detail below. In certain embodiments, TSVs 24 may be electrically connected to second substrate 18 by way of solder bumps 26.

It is advantageous in the use of carbon nanotubes to have low contact resistance between the carbon nanotube and the metal elements to which the carbon nanotube is connected. This is due to the fact that the carbon nanotube operates by detecting a change in the resistance of the carbon nanotube. If the resistance of the carbon nanotube itself is much lower than the contact resistance between the metal and the carbon nanotube, the change in resistance of the carbon nanotube as a result of sensing will not, or only, barely change the resistance of the entire sensor, because the resistance of the whole sensor is mostly contact resistance. Thus, the functionality and sensitivity of the sensing device can be improved by lowering the contact resistance between the metal and the carbon nanotube.

Thus, in order to maintain low contact resistance, sensor 14 may be electrically connected to TSVs 24 by way of metal contact pads 28. In certain embodiments, each sensor 14 may be electrically connected to two contact pads 28, with one serving as a source and the other serving as a drain for sensor 14.

It is to be appreciated that when used in an aqueous environment, semiconducting carbon nanotubes may be hole doped, or p-doped, from absorption of water and/or change transfer from oxygen. To get low resistance when using metal contacts in conjunction with p-doped semiconducting carbon nanotubes, a high work function metal must be used. Otherwise a metal-semiconductor diode, also known as a Shottkey diode, will be formed at the junction, which increases the contact resistance drastically. It is to be appreciated that typical commercially available materials typically used for some TSVs, including Cu and Ag, are not suitable for the low resistance contacts necessary for use with carbon nanotubes. Thus, suitable metals used for forming contact pads 28 include Ti, TiN, Pd, Au, and Pt.

Contact pads 28 may be deposited on first substrate 12. Such deposition of a metal at desired locations or in a desired pattern on first substrate 12 can be accomplished using metal deposition methods in combination with lithographic methods known to those of skill in the art, such as shadow mask lithography or photolithography.

Exemplary lithographic methods are described in U.S. application Ser. No. 16/155,955, filed on Oct. 10, 2018, and entitled "Carbon Nanotube-Based Device for Sensing Molecular Interaction," the entire disclosure of which is incorporated herein by reference in its entirety for all purposes.

It is to be appreciated in order to provide low contact resistance at the connection between the contact pads 28 and carbon nanotube sensor 14, the metal of contact pads 28 must surround an end of the carbon nanotube sensor such that ends of the carbon nanotubes are embedded in the contact pads. Such a configuration provides good electrical contact between contact pads 28 and carbon nanotube sensor 14.

In order to embed the ends of the carbon nanotubes in the metal of the contact pads, it is advantageous to deposit the metal used to form contact pads 28 after deposition of the nanotubes on first substrate 12. By doing so, the metal will completely surround ends of the carbon nanotubes, thereby completely embedding the ends of the carbon nanotubes in the metal of contact pads 28 during the deposition of the metal.

An encapsulant 29 may be provided at the junction, seam, or interface between first substrate 12 and second substrate 18, helping seal this interface and prevent material from entering the interface and compromising the components therein. For example, the encapsulant helps protects the components within sensing device 10 from harmful components of the aqueous solutions in which sensing device 10 may be placed during use.

Suitable encapsulants include epoxy, plastic, and silicone, for example. Other suitable encapsulants will become readily apparent to those skilled in the art, given the benefit of this disclosure. Encapsulant 29 may be placed on sensing device 10 at the interface between first substrate 12 and second substrate 18 by injection molding, printing, micropipette dispersing, for example. In other embodiments, first substrate 12 and second substrate 18 could be immersed together in a suitable encapsulant to a depth such that the top of the first substrate 12 and sensor 14 do not come into contact with the encapsulant. Other suitable methods of positioning encapsulant 29 at the interface between first substrate 12 and second substrate 18 will become readily apparent to those skilled in the art, given the benefit of this disclosure.

Figure 3:
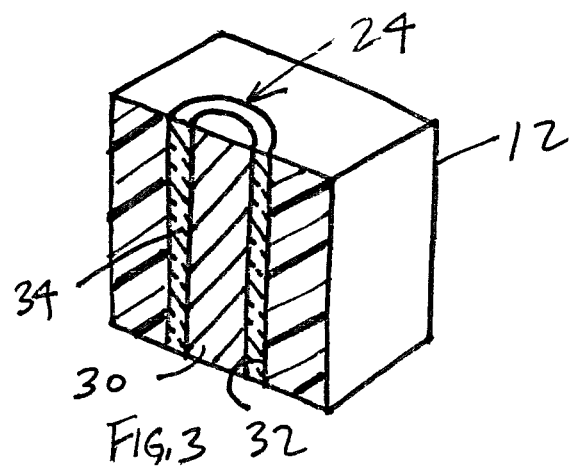
FIG. 3 is a perspective view, partially in section, of the first substrate of the sensing device of FIG. 1.

An embodiment of a TSV 24 is seen in FIG. 3, and may be formed of a via or conductive plug 30 positioned within a through hole or aperture 32 that extends completely through first substrate 12. In certain preferred embodiments, aperture 32 has a diameter of between approximately 5 µm and approximately 200 µm, more preferably between approximately 10 µm and approximately 50 µm, and most preferably between approximately 10 µm and approximately 25 µm.

Conductive plug 30 serves to provide the electrical connection between a contact pate 28 and second substrate 18. In certain embodiments, conductive plug 30 may be formed of a metal. Exemplary metals include, but are not limited to Cu, Au plated Cu, Cu/Al, Au plated Cu/Al, Ag, and Au plated Ag. In other embodiments, conductive plug 30 may be formed of doped polysilicon. Other suitable materials for conductive plug 30 will become readily apparent to those skilled in the art, given the benefit of this disclosure.

In certain preferred embodiments, conductive plug 30 has a diameter of between approximately 5 µm and approximately 200 µm, more preferably between approximately 10 µm and approximately 50 µm, and most preferably between approximately 10 µm and approximately 25 µm.

In certain embodiments, an insulating liner 34 may be positioned within aperture 32 between conductive plug 30 and first substrate 12. Liner 34 serves to insulate the conductive plug 30 of TSV 24 from adjacent TSVs when a plurality of TSVs are positioned in first substrate 12. Liner 34 may be formed of SiO2, or SiN, for example. Other suitable materials for liner 34 will become readily apparent to those skilled in the art, given the benefit of this disclosure.

In certain preferred embodiments, liner 34 has a thickness of between approximately 0.2 µm and approximately 2 µm.

The term "approximately" as used herein is meant to mean close to, or about a particular value, within the constraints of sensible, commercial engineering objectives, costs, manufacturing tolerances, and capabilities in the field of sensor manufacturing and use. Similarly, the term "substantially" as used herein is meant to mean mostly, or almost the same as, within the constraints of sensible, commercial engineering objectives, costs, manufacturing tolerances, and capabilities.

Figure 4:
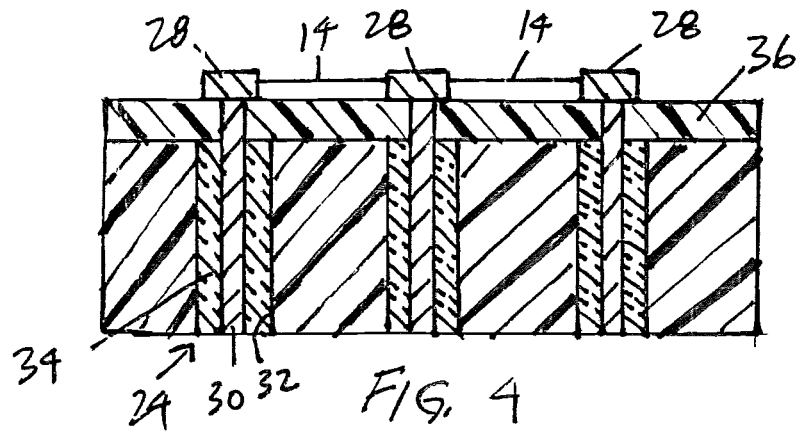
FIG. 4 is a section view of an alternative embodiment of the sensing device of FIG. 1.

FIG. 4 is a sectional view of an embodiment with a plurality of sensors 14 on first substrate 12 and corresponding contact pads 28 and TSVs 24. In certain embodiments, an array of sensors 14 may be disposed on first substrate 12. As illustrated here, adjacent sensors 14 may share a contact pad 28 positioned therebetween, which may serve to act as a common drain for the two sensors 14. In the illustrated embodiment, an insulating layer 36 may be positioned between a top or uppermost surface of first substrate 12 and contact pads 28 and sensors 14. In certain embodiments, insulating layer 36 may be formed of SiO2, or SiN, for example. Other suitable materials for insulating layer 36 will become readily apparent to those skilled in the art, given the benefit of this disclosure. It is to be appreciated that insulating layer 36 may be formed of the same, or different, material as that of liner 34.

Figure 5:
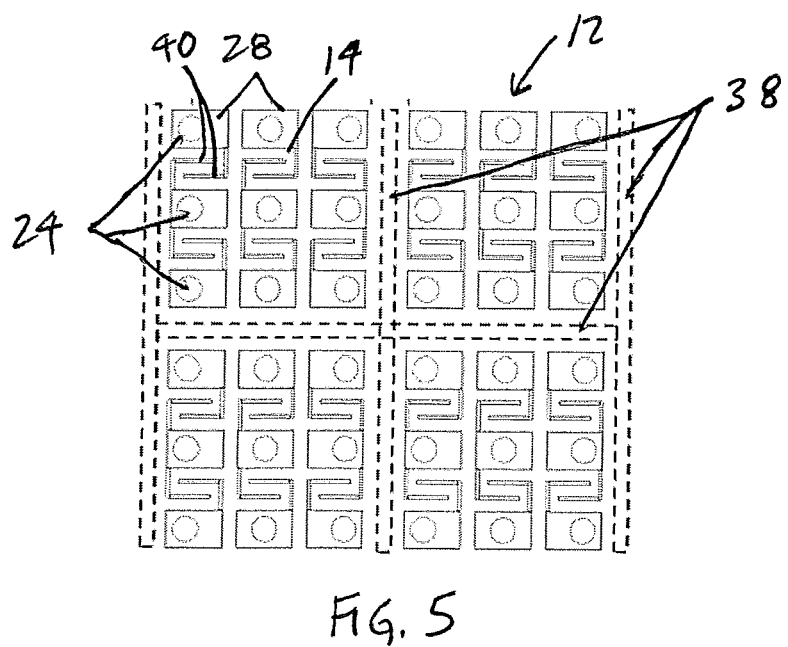
FIG. 5 is a plan view of a substrate with an array of sensors in accordance with an alternative embodiment.

In certain embodiments, a plurality of arrays of sensors 14 and associated components may be formed on a single wafer such as first substrate 12. For example, as seen in FIG. 5, four 3×2 arrays of sensors 14 and associated contact pads 28 and TSVs 24 are formed on a wafer sized first substrate 12. After the arrays of are formed, the wafer sized first substrate 12 may be cut, or diced, along cut lines 38, thereby forming a plurality of dies, or first substrates 12, each including an array of sensors 14 and associated components.

It is to be appreciated that any number of sensors and associated components may be formed on a single wafer, slab, or sheet, and that the number is limited only by the size of the sensors, contact pads, TSVs and the wafer, slab, or sheet itself. Thus, it is to be appreciated that positioning a plurality of sensors on the same substrate provides impetus for reducing the size of the sensor and associated components. The smaller that the sensor, contact pad, and TSV can be manufactured, the more sensing devices can be provided on a die and, therefore, on a wafer, slab, or sheet, which will improve the scalability of the sensing devices.

It is to be appreciated that electrical noise will determine the limit of detection and sensitivity of the carbon nanotube sensor, as determined by the signal-to-noise ratio. Increasing the device area and increasing the device conductivity are two ways to increase the signal to noise ratio. The contact pads can be used to increase the effective channel or sensor conductivity by modifying the geometry of the contact pads to increase the conductivity of the sensor. An example of increasing the channel conductivity with the contact pad geometry is illustrated in FIG. 5. As seen here, the surface area of contact pads 28 can be increased by providing extensions 40 on contact pads 28, increasing the surface area of contact pads 28 and thereby increasing the conductivity of sensors 14.

As illustrated here, extensions 40 are substantially L shaped, or reverse L shaped, members extending from contact pads 28 out over first substrate 12. Extensions 40 of adjacent contact pads 28 are seen here to nest with one another. It is to be appreciated that extensions 40 need not necessarily be L shaped or reverse L shaped.

In the embodiment illustrated, the conductivity of sensors 14 with the contact pad geometry seen in FIG. 5 is approximately 10 times more conductive than that with contact pads 28 that lack extensions 40, making the sensitivity and limit of detection more than 3 times better.

Thus, it can be appreciated that the use of contact pads 28 as described herein provide an electrical connection between sensors 14 and TSVs 24 that can reduce the contact resistance and increase the conductivity of sensors 14. This results in increased signal to noise ratio and increased detection capabilities.

A method of forming a device with a carbon nanotube sensor will now be described. As seen in FIGS. 3 and 4, one or more TSVs 24 is formed in first substrate 12. As noted above, first substrate 12 may be formed of silicon, or glass, for example. TSVs 24 are formed by creating a through aperture 32 extending completely through first substrate 12.

An insulating liner 34 may then be positioned within aperture 32 and a conductive plug 30 is then formed within an interior of insulating liner 34. Liner 34 serves to insulate the conductive plug 30 of TSV 24 from adjacent TSVs when a plurality of TSVs are positioned in first substrate 12. Liner 34 may be formed of SiO2, or SiN, for example, while conductive plug 30 may be formed of metals such as Cu, Au plated Cu, Cu/Al, Au plated Cu/Al, Ag, and Au plated Ag, or doped polysilicon, for example.

After one or more TSVs 24 have been formed in first substrate 12, an insulating layer 36 may be positioned on top of first substrate 12, as seen in FIG. 4. Insulating layer 36 may be formed of SiO2, or SiN, for example.

Carbon nanotubes as sensor 14 are then deposited on first substrate 14 as described above. Depositing the carbon nanotubes 14 on first substrate 14 after formation of the TSVs advantageously eliminates any possible damage to the carbon nanotubes from formation of the TSVs. If the TSVs were formed after the deposition of the carbon nanotubes, the high temperatures and/or plasma processing used to form the TSVs could damage the carbon nanotubes.

Contact pads 28 are then formed on top of first substrate 12 and sensors 14 as discussed above and seen in FIGS. 1, 2, and 4. As noted above, and seen in FIG. 5, the surface area of contact pads 28 can be increased by providing extensions 40 on contact pads 28, increasing the surface area of contact pads 28 and thereby increasing the conductivity of sensors 14.

If first substrate 12 has been formed with a plurality of sensors 14 and associated contact pads 28 and TSVs 24, first substrate 12 can then be diced into a plurality of first substrates 12, each of which can contain an array of sensors 14, as seen in FIG. 5. In this illustrated embodiment, each of the plurality of first substrates 12 includes a 3×2 array of sensors 14.

First substrate 12 is then connected to second substrate 18 by connecting TSVs 24 to second substrate 18, which may be a PCB. Solder in the form of solder bumps 26, solder paste, or other conducting material is applied to second substrate 18 at positions where TSVs 24 will contact second substrate 18. First substrate 12 is then seated on first surface 16 of second substrate 18 and sensing device 10 is heated to a point where solder bumps 26 will flow, thereby connecting TSVs 24 to suitable contact points on second substrate 18.

Encapsulant 29 may then be positioned on sensing device 10 at an interface between first substrate 12 and second substrate 18, as illustrated in FIG. 2. Encapsulant 29 may be formed of epoxy, plastic, or silicone, for example. Encapsulant 29 may be deposited on sensing device 10 by injection molding, printing, micropipette dispersing, for example.

Those having skill in the art, with the knowledge gained from the present disclosure, will recognize that various changes can be made to the disclosed apparatuses and methods in attaining these and other advantages, without departing from the scope of the present invention. As such, it should be understood that the features described herein are susceptible to modification, alteration, changes, or substitution. For example, it is expressly intended that all combinations of those elements and/or steps which perform substantially the same function, in substantially the same way, to achieve the same results are within the scope of the invention. Substitutions of elements from one described embodiment to another are also fully intended and contemplated. The specific embodiments illustrated and described herein are for illustrative purposes only, and not limiting of the invention as set forth in the appended claims. Other embodiments will be evident to those of skill in the art. It should be understood that the foregoing description is provided for clarity only and is merely exemplary. The spirit and scope of the present invention are not limited to the above examples, but are encompassed by the following claims. All publications and patent applications cited above are incorporated by reference in their entirety for all purposes to the same extent as if each individual publication or patent application were specifically and individually indicated to be so incorporated by reference.

What is claimed is:

1. A sensing device comprising:
a first substrate with an array of sensors each comprising a coating of p-doped carbon nanotubes disposed thereon, a pair of Through Substrate Vias (TSVs) extending therethrough, and a pair of contact pads positioned on the first substrate, each constructed from a high work function metal that completely surrounds an end of each of a plurality of the p-doped carbon nanotubes to embed the ends of the plurality of p-doped carbon nanotubes in the contact pad, wherein at least one of the contact pads from each sensor comprises an outward extension that nests with an outward extension of a neighboring sensor; and
a Printed Circuit Board (PCB) positioned adjacent the first substrate, wherein the TSVs electrically connect the p-doped carbon nanotubes to the PCB by way of the contact pads.

2. The sensing device of claim 1, wherein the first substrate is constructed from silicon or glass.

3. The sensing device of claim 1, wherein the PCB includes a gate on a side of the PCB opposite to a side of the PCB to which the first substrate is adjacent.

4. The sensing device of claim 3, wherein a solder bump is provided between the TSV and the PCB.

5. The sensing device of claim 1, further comprising an encapsulant positioned about an interface between the first substrate and the PCB.

6. The sensing device of claim 5, wherein the encapsulant is one of epoxy, plastic, and silicone.

7. The sensing device of claim 1, wherein the high work function metal comprises one of Ti, TiN, Pd, Au and Pt.

8. The sensing device of claim 1, further comprising an insulating layer between the first substrate and the coating of p-doped carbon nanotubes with the contacts pads.

9. The sensing device of claim 8, wherein the insulating layer is formed of one of $SiO_2$ and SiN.

10. The sensing device of claim 1, wherein the extension from each sensor comprises a substantially L shaped extension extending outwardly from the contact pad.

11. A method of forming a sensing device comprising the steps of:
forming a pair of Through Substrate Vias (TSVs) in a first substrate;
depositing an array of the sensors on the first substrate each comprising a coating of p-doped carbon nanotubes;
forming a pair of contact pads on the first substrate, each constructed from a high work function metal that completely surrounds an end of each of a plurality of the p-doped carbon nanotubes to embed the ends of the plurality of p-doped carbon nanotubes in the contact pad, wherein at least one of the contact pads from each sensor comprises an outward extension that nests with an outward extension of a neighboring sensor; and
positioning the first substrate adjacent a Printed Circuit Board (PCB); and
forming an electrical connection between the TSVs and the PCB, wherein the TSVs electrically connect the p-doped carbon nanotubes to the PCB by way of the contact pads.

12. The method of claim 11, further comprising the step of encapsulating an interface between the first substrate and the PCB.

13. The method of claim 12, wherein the step of encapsulating is performed with one of epoxy, plastic, and silicone.

14. The method of claim 11, further comprising the step of positioning an insulating layer on the first substrate before depositing the sensor on the first substrate.

15. The method of claim 14, wherein the insulating layer is formed of one of $SiO_2$ and SiN.

16. The method of claim 11, further comprising the step of providing a gate on a side of the PCB opposite a side of the PCB to which the first substrate is adjacent.

17. The method of claim 11, wherein the first substrate is constructed from silicon or glass.

18. The method of claim 11, wherein the step of forming an electrical connection between the TSVs and the PCB comprises:
positioning a solder bump between each of the TSVs and the PCB; and
heating the device to melt the solder bumps and form the electrical connection.

19. The method of claim 11, wherein the high work function metal comprises one of Ti, TiN, Pd, Au and Pt.

20. The method of claim 11, wherein the extension from each sensor comprises a substantially L shaped extension extending outwardly from the contact pad.

21. A method of forming a sensing device comprising the steps of:
forming a plurality of Through Substrate Vias (TSVs) in a first substrate;
depositing an array of sensors each comprising a coating of p-doped carbon nanotubes on the first substrate;
forming a pair of contact pads for each of the sensors on the first substrate, each pair of contact pads constructed from a high work function metal that completely surrounds an end of each of a plurality of the p-doped carbon nanotubes to embed the ends of the plurality of p-doped carbon nanotubes in the contact pad;
dicing the first substrate to form a plurality of first substrates, each of the plurality of first substrates including a plurality of the sensors, TSVs and contact pads,
positioning each first substrate adjacent a Printed Circuit Board (PCB);
forming electrical connections between the TSVs and the PCBs, wherein the TSVs electrically connect the p-doped carbon nanotubes to the PCBs by way of the contact pads.

22. The method of claim 21, further comprising the step of encapsulating an interface between the first substrates and the PCBs.

23. The method of claim 22, wherein the step of encapsulating is performed with one of epoxy, plastic, and silicone.

24. The method of claim 21, further comprising the step of positioning an insulating layer on the first substrate before depositing the array of sensors on the first substrate.

25. The method of claim 24, wherein the insulating layer is formed of one of $SiO_2$ and SiN.

26. The method of claim 21, further comprising the step of providing a gate on a side of each PCB opposite a side of each PCB to which one of the first substrates is adjacent.

27. The method of claim 21, wherein the first substrate is constructed from silicon or glass.

28. The method of claim 21, wherein the step of forming an electrical connection between the TSVs and the PCBs comprises:
positioning a solder bump between each of the TSVs and the PCBs; and
heating the device to melt the solder bumps and form the electrical connection.

29. The method of claim 21, wherein the high work function metal comprises one of Ti, TiN, Pd, Au and Pt.

30. The method of claim 21, wherein at least one of the contact pads from each sensor comprises an outward extension that nests with an outward extension of a neighboring sensor.

* * * * *